United States Patent
Chen

(10) Patent No.: US 12,438,536 B2
(45) Date of Patent: Oct. 7, 2025

(54) HALF-BRIDGE DRIVER AND HALF-BRIDGE DRIVING METHOD HAVING SLEW RATE ADJUSTMENT FUNCTION

(71) Applicant: Richtek Technology Corporation, Hsinchu (TW)

(72) Inventor: Yi-Kuang Chen, Taichung (TW)

(73) Assignee: Richtek Technology Corporation, Hsinchu (TW)

( * ) Notice: Subject to any disclaimer, the term of this patent is extended or adjusted under 35 U.S.C. 154(b) by 151 days.

(21) Appl. No.: 18/487,997

(22) Filed: Oct. 16, 2023

(65) Prior Publication Data

US 2024/0146295 A1 May 2, 2024

(30) Foreign Application Priority Data

Nov. 2, 2022 (TW) .................................. 111141849

(51) Int. Cl.
*H03K 17/16* (2006.01)
*H02M 1/088* (2006.01)
*H02M 1/44* (2007.01)

(52) U.S. Cl.
CPC .......... *H03K 17/162* (2013.01); *H02M 1/088* (2013.01); *H02M 1/44* (2013.01);
(Continued)

(58) Field of Classification Search
CPC ......... H03K 17/162; H03K 2217/0063; H03K 2217/0072; H03K 17/063; H03K 17/687; H03K 17/0822; H03K 17/6871; H03K 17/04206; H03K 17/163; H03K 17/302; H03K 17/6214; H03K 19/00361; H03K 2217/0036; H03K 2217/0081; H03K 17/00; H03K 17/08122; H03K 17/145; H03K 17/567; H03K 19/0013; H03K 19/018507; H03K 19/018521; H03K 3/012; H03K 5/04; H03K 17/0406; H03K 17/164; H03K 17/166; H03K 17/6877; H03K 19/0175; H03K 19/018571; H03K 5/08; H03K 5/12; H03K 7/08; H03K 17/165;
(Continued)

(56) References Cited

U.S. PATENT DOCUMENTS

2011/0285378 A1* 11/2011 Tamaoka ................ H02M 1/38
323/351

FOREIGN PATENT DOCUMENTS

WO     WO-2022180924 A1 *  9/2022

* cited by examiner

*Primary Examiner* — Lincoln D Donovan
*Assistant Examiner* — James G Yeaman
(74) *Attorney, Agent, or Firm* — Huan-Yi Lin

(57) ABSTRACT

A half-bridge driver drives a half-bridge circuit. The half-bridge driver includes a switch selection circuit and at least one slew rate adjustment circuit, wherein the slew rate adjustment circuit includes a pulse-width control unit, an adjustment pulling unit and a halt adjustment pulling unit. The switch selection circuit generates a source current or a sink current to correspondingly pull up or pull down the gate-source voltage of the upper switch or the lower switch, thereby turning-on or turning-off the upper switch or the lower switch. The adjustment pulling unit is for adjusting the pulling-up or pulling-down of the gate-source voltage of the upper switch or the lower switch. The stop-adjustment pulling unit is for stopping adjusting the pulling-up or pulling-down of the gate-source voltage of the upper switch or the lower switch.

20 Claims, 8 Drawing Sheets

(52) U.S. Cl.
CPC ............... *H03K 2217/0063* (2013.01); *H03K 2217/0072* (2013.01)

(58) Field of Classification Search
CPC  H03K 19/017509; H02M 1/088; H02M 1/44; H02M 1/08; H02M 1/0029; H02M 1/0006; H02M 1/32; H02M 1/38; H02M 3/158; H02M 7/4837; H02M 1/0012; H02M 3/156; H02M 3/157; H02M 7/538; H02M 1/0032; H02M 3/1582; H02M 7/5387; H02P 27/00; H02P 27/08; H02P 29/00; H02P 29/02; H02P 27/06; H02P 29/0241; H02P 29/032; H02P 6/18; H02P 6/28

See application file for complete search history.

HALF-BRIDGE DRIVER AND HALF-BRIDGE DRIVING METHOD HAVING SLEW RATE ADJUSTMENT FUNCTION

CROSS REFERENCE

The present invention claims priority to TW 111141849 filed on Nov. 2, 2022.

BACKGROUND OF THE INVENTION

Field of Invention

The present invention relates to a half-bridge driver, in particular to a half-bridge driver with a slew rate adjustment function. The present invention also relates to a half-bridge driving method with a slew rate adjustment function.

Description of Related Art

Half-bridge drivers are widely used in various circuits (such as half-bridge circuits), wherein the half-bridge drivers are configured to generate control signals to drive the switches of the half-bridge circuits, thereby controlling the half-bridge circuits to convert an input voltage to an output voltage. However, when the slew rate of the switches is not properly controlled, the parasitic inductance in the half-bridge driver or the half-bridge circuit may cause an electromagnetic interference (EMI) problem, which will negatively affect the entire circuit.

U.S. Pat. Nos. 9,722,593B2, 9,231,583B2 and 10,848,148B2 are related conventional art. The half-bridge drivers disclosed in these patents are all high-voltage drivers which are required to operate in a high-voltage range to adjust the driving voltage of the half-bridge circuit. Therefore, circuits and devices that can withstand high voltages are required. Furthermore, these circuits need to be able to select and drive different numbers of high-voltage devices according to different requirements, so the manufacturing cost and circuit area are high. In addition, in order to adjust the slew rate of the output voltage, the half-bridge driver of the conventional art needs a gate-source voltage sensing circuit and a drain-source voltage sensing circuit, which make the half-bridge driver relatively large. Moreover, the half-bridge driver of the conventional art cannot recycle to reuse the charges accumulated in the gate-source capacitor of the half-bridge circuit when driving the half-bridge circuit, resulting in high power loss.

In view of the above, the present invention aims at improving the shortcomings of the above-mentioned conventional art, and proposes a half-bridge driver with a slew rate adjustment function to effectively control the half-bridge circuit, thereby mitigating the electromagnetic interference problem, reducing the number of the high-voltage devices, reducing the circuit area, reducing the manufacturing cost, and being capable of recycling the charges accumulated in the gate-source capacitor of the half-bridge circuit to reduce the power loss.

SUMMARY OF THE INVENTION

From one perspective, the present invention provides a half-bridge driver for driving a half-bridge circuit, wherein the half-bridge circuit comprises a high-side switch and a low-side switch connected in series with each other, and the half-bridge driver comprises: a switch selection circuit, configured to turn on or off the high-side switch or the low-side switch according to a control signal, and to generate a source current or a sink current to correspondingly pull up or pull down a gate-source voltage of the high-side switch or the low-side switch, so as to turn on or turn off the high-side switch or the low-side switch, to thereby convert an input voltage into an output voltage; and at least one slew rate adjustment circuit, coupled to the half-bridge circuit, wherein the slew rate adjustment circuit comprises: a pulse width control unit, configured to generate an adjustment pulling control signal with a preset pulse according to the control signal; an adjustment pulling unit, configured to pull up or pull down the gate-source voltage of the high-side switch or the low-side switch according to the adjustment pulling control signal, so as to adjust a slew rate of the output voltage; and a stop-adjustment pulling unit, coupled to the adjustment pulling unit, configured to stop pulling up or pulling down the gate-source voltage of the high-side switch or the low-side switch according to a preset threshold; wherein a voltage difference between a high power voltage and a low power voltage of the slew rate adjustment circuit is less than a voltage difference between a power supply voltage and a ground potential; wherein the power supply voltage is higher than the input voltage and the output voltage.

From one perspective, the present invention provides a half-bridge driving method for driving a half-bridge circuit, wherein the half-bridge circuit comprises a high-side switch and a low-side switch connected in series with each other, and the half-bridge driving method comprises: determining to turn on or turn off the high-side switch or the low-side switch according to a control signal, and generating a source current or a sink current to correspondingly pull up or pull down the gate-source voltage of the high-side switch or the low-side switch, thereby turning on or off the high-side switch or the low-side switch, so as to convert an input voltage into an output voltage; and a slew rate adjustment step, comprising: generating an adjustment pulling control signal with a preset pulse according to the control signal; pulling up or pulling down the gate-source voltage of the high-side switch or the low-side switch according to the adjustment pulling control signal, so as to adjust a slew rate of the output voltage; and stopping pulling up or pulling down the gate-source voltage of the high-side switch or the low-side switch according to a preset threshold; wherein the slew rate adjustment step is executed between a high power voltage and a low power voltage, and a voltage difference between the high power voltage and the low power voltage is less than a voltage difference between a power supply voltage and a ground potential; wherein the power supply voltage is greater than the input voltage and the output voltage.

In one embodiment, the at least one slew rate adjustment circuit comprises a high-side adjustment pull-up slew rate adjustment circuit, a high-side adjustment pull-down slew rate adjustment circuit, a low-side adjustment pull-up slew rate adjustment circuit, and/or a low-side adjustment pull-down slew rate adjustment circuit.

In one embodiment, the adjustment pulling unit pulls up or pulls down the gate-source voltage of the high-side switch or the low-side switch for an adjustment period, and the adjustment period is related to a pulse width of the preset pulse, the preset threshold, and/or a level of the adjustment pulling control signal.

In one embodiment, the adjustment pulling unit comprises at least one MOS device, and the adjustment period is related to a number of the at least one MOS device coupled in parallel.

In one embodiment, the stop-adjustment pulling unit comprises at least one diode device, and the preset threshold is related to a number of the at least one diode device coupled in series.

In one embodiment, the slew rate adjustment circuit comprises the high-side adjustment pull-down slew rate adjustment circuit and/or the low-side adjustment pull-down slew rate adjustment circuit, and during the adjustment period, the high-side adjustment pull-down slew rate adjustment circuit and/or the low-side adjustment pull-down slew rate adjustment circuit pulls down the gate-source voltage of the high-side switch and/or the low-side switch to generate an adjustment pull-down current, which flows through the corresponding stop-adjustment pulling unit to a regulating power, so that the electric energy of the adjustment pull-down current is reusable.

In one embodiment, the stop-adjustment pulling unit is a unidirectional conduction device for preventing a reverse current flow.

In one embodiment, the switch selection circuit comprises: a high-side switch selection circuit, configured to turn on or off the high-side switch according to the control signal, and to generate a high-side source current or a high-side sink current to correspondingly pull up or pull down the gate-source voltage of the high-side switch, thereby turning on or off the high-side switch; and a low-side switch selection circuit, configured to turn on or turn off the low-side switch according to the control signal, and to generate a low-side source current or a low-side sink current to correspondingly pull up or pull down the gate-source voltage of the low-side switch, thereby turning on or off the low-side switch; wherein the source current comprises the high-side source current or the low-side source current; and wherein the sink current comprises the high-side sink current or the low-side sink current.

In one embodiment, the half-bridge driver further comprises a level shifter circuit configured to shift the level of the control signal to generate a level-shifted control signal and input the level-shifted control signal to the high-side switch selection circuit.

In one embodiment, the at least one MOS device of the adjustment pulling unit of the high-side adjustment pull-down slew rate adjustment circuit has a withstand voltage greater than a voltage difference between the input voltage and the ground potential.

In one embodiment, the at least one diode device of the stop-adjustment pulling unit of the high-side adjustment pull-up slew rate adjustment circuit has a withstand voltage greater than a voltage difference between the input voltage and the ground potential.

In one embodiment, a voltage difference between the high power voltage and the low power voltage is not greater than 5 volts, and the supply voltage is not less than 20 volts.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
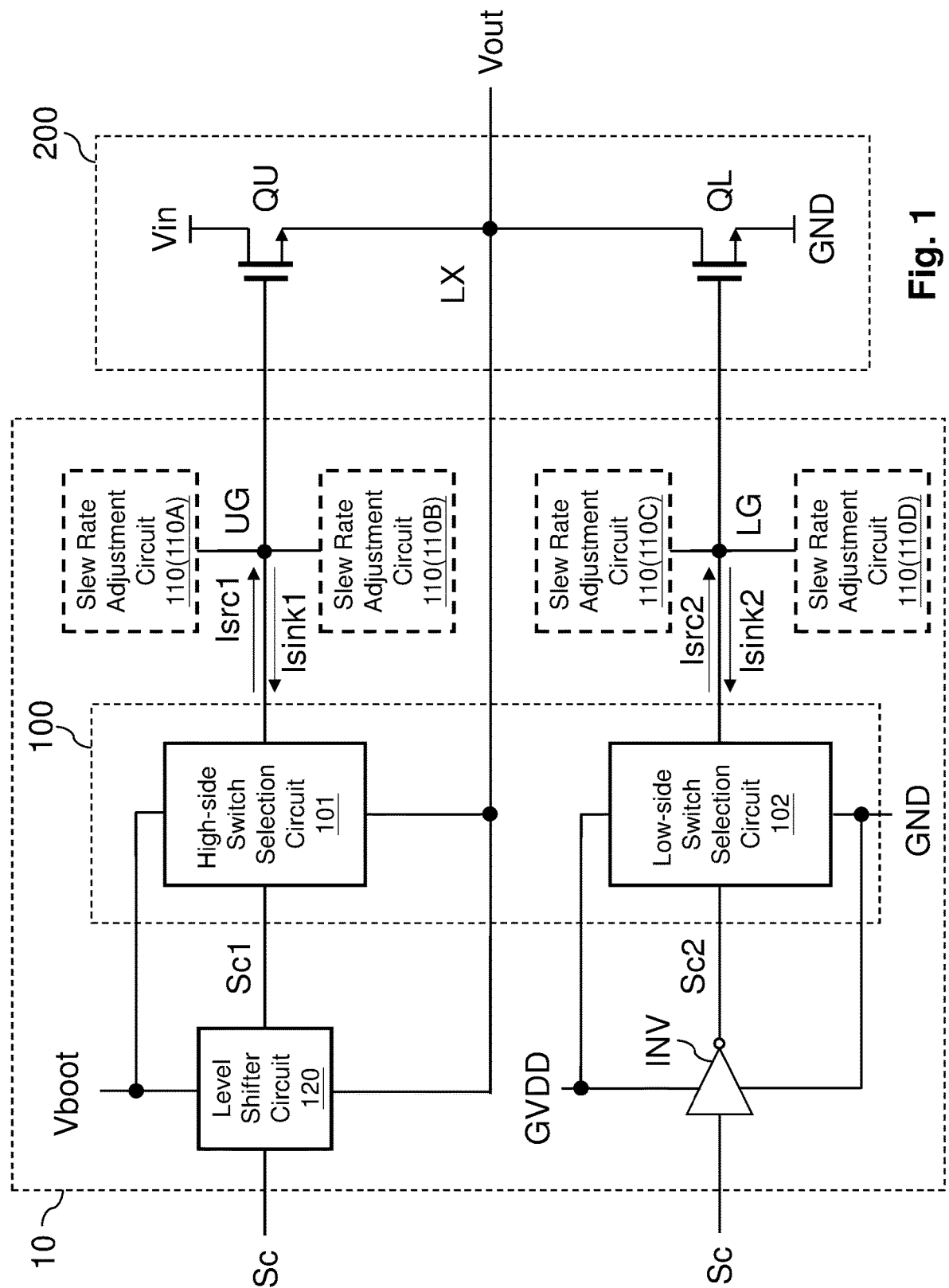
FIG. 1 is a modular block diagram of a half-bridge driver according to an embodiment of the present invention.

Please refer to FIG. 1. FIG. 1 is a modular block diagram of a half-bridge driver 10 according to an embodiment of the present invention. The half-bridge driver 10 is configured to drive a half-bridge circuit 200, wherein the half-bridge circuit 200 includes a high-side switch QU and a low-side switch QL connected in series with each other. As shown in FIG. 1, the half-bridge driver 10 includes a switch selection circuit 100, at least one slew rate adjustment circuit 110, a level shifter circuit 120, and an inverter INV. In the present embodiment, the switch selection circuit 100 includes a high-side switch selection circuit 101 and a low-side switch selection circuit 102. The high-side switch selection circuit 101 is coupled between the level shifter circuit 120 and the high-side switch QU. The low-side switch selection circuit 102 is coupled between the inverter INV and the low-side switch QL. In the present embodiment, the at least one slew rate adjustment circuit 110 is shown by a dotted frame to illustrate that according to the present invention, the slew rate adjustment circuit 110 can include one or more of the slew rate adjustment circuits 110A, 110B, 110C, and 110D. The slew rate adjustment circuit 110 is coupled to the switch selection circuit 100 and is coupled to the gate UG of the high-side switch QU and/or the gate LG of the low-side switch QL.

In some embodiments, the switch selection circuit 100 is configured to turn on or off the high-side switch QU or the low-side switch QL according to a control signal Sc. Besides, the switch selection circuit 100 generates a high-side source current Isrc1, a high-side sink current Isink1, a low-side source current Isrc2, or a low-side sink current Isink2 according to the control signal Sc to charge the gate-source capacitor of the high-side switch QU to pull up the gate-source voltage of the high-side switch QU to turn on the high-side switch QU, discharge the gate-source capacitor of the high-side switch QU to pull down the gate-source voltage of the high-side switch QU to turn off the high-side switch QU, charge the gate-source capacitor of the low-side switch QL to pull up the gate-source voltage of the low-side switch QL to turn on the low-side switch QL, or discharge the gate-source capacitor of the low-side switch QL to pull down the gate-source voltage of the low-side switch QL to turn off the low-side switch QL, thereby converting an input voltage Vin received by the high-side switch QU into an output voltage Vout generated at a node LX. The node LX can be further coupled to an inductor, so that the half-bridge circuit 200 can be applied to, e.g., a switching regulator or a class-D amplifier circuit.

It should be noted that, in the operation of the half-bridge circuit 200, the high-side switch QU and the low-side switch QL will not be on (conductive) at the same time; therefore, the high-side source current Isrc1 and the low-side source current Isrc2 will not be generated at the same time, so the high-side source current Isrc1 and the low-side source current Isrc2 can be collectively referred to as a source current. On the other hand, the high-side sink current Isink1 and the low-side sink current Isink2 will not be generated at the same time, so the high-side sink current Isink1 and the low-side sink current Isink2 can be collectively referred to as a sink current. In addition, according to the present invention, the slew rate adjustment circuit 110 can include one or more of the slew rate adjustment circuits 110A, 110B, 110C, and 110D, which means that at least one, or more than one of the slew rate adjustment circuits 110A, 110B, 110C, and 110D, can provide the effect of adjusting and improving the slew rate of the output voltage Vout.

The slew rate adjustment circuit 110 is coupled to the half-bridge circuit 200; when the switch selection circuit 100 pulls up or pulls down the gate-source voltage of the high-side switch QU or the low-side switch QL, the slew rate adjustment circuit 110 adjusts an adjustment period for pulling up or pulling down of the gate-source voltage of the high-side switch QU or the low-side switch QL, so as to adjust (for example, shorten) the switching time of turning on or off the high-side switch QU or the low-side switch QL, thereby increasing the switching speed of the half-bridge circuit 200 or reducing the electromagnetic interference effect. As such, the present invention can achieve an optimal adjustment between improving the anti-electromagnetic interference performance and improving the switching speed.

According to the present invention, the voltage difference between a high power voltage VH and a low power voltage VL (to be described in detail later) of the slew rate adjustment circuit 110 is less than the voltage difference between a power supply voltage Vboot and a ground potential GND. That is, the voltage difference between the high power voltage VH and the low power voltage VL supplies power to the pulse width control unit of the slew rate adjustment circuit 110, and the pulse width control unit operates between the high power voltage and the low power voltage. The voltage difference between the high power voltage and the low power voltage has a lower voltage range than the voltage difference between the power supply voltage Vboot and the ground potential GND. In this way, the pulse width control unit of the slew rate adjustment circuit 110 operates at a lower voltage range and its components require only low-voltage devices and do not need high-voltage devices that can withstand high voltages. Generally speaking, the so-called high-voltage devices refer to devices that operate above 5V, and low-voltage devices refer to devices that operate no greater than 5V. In one embodiment, the high power voltage VH is, for example but not limited to, equal to the internal voltage GVDD, and the low power voltage VL is, for example but not limited to, equal to the ground potential GND.

According to the present invention, the slew rate adjustment circuits 110A and 110B coupled to the high-side switch selection circuit 101 require fewer high voltage devices that need to withstand high voltage as compared to the conventional art, and the slew rate adjustment circuits 110C and 110D operate at low voltage range. Therefore, the half-bridge driver 10 according to the present invention at least has the following advantages over the conventional art, including: reduced number of high-voltage devices, reduced the circuit area, and reduced manufacturing cost. In addition, when the slew rate adjustment circuit 110B or 110D pulls down the gate-source voltage of the high-side switch QU or the low-side switch QL, the generated adjustment pull-down current will flow to the default power supply, whereby the power is recycled to be reused, thus reducing the power loss as compared to the conventional art. The respective structures and functions of the switch selection circuit 100 and the slew rate adjustment circuit 110 and their cooperation will be explained in detail below.

Figure 2:
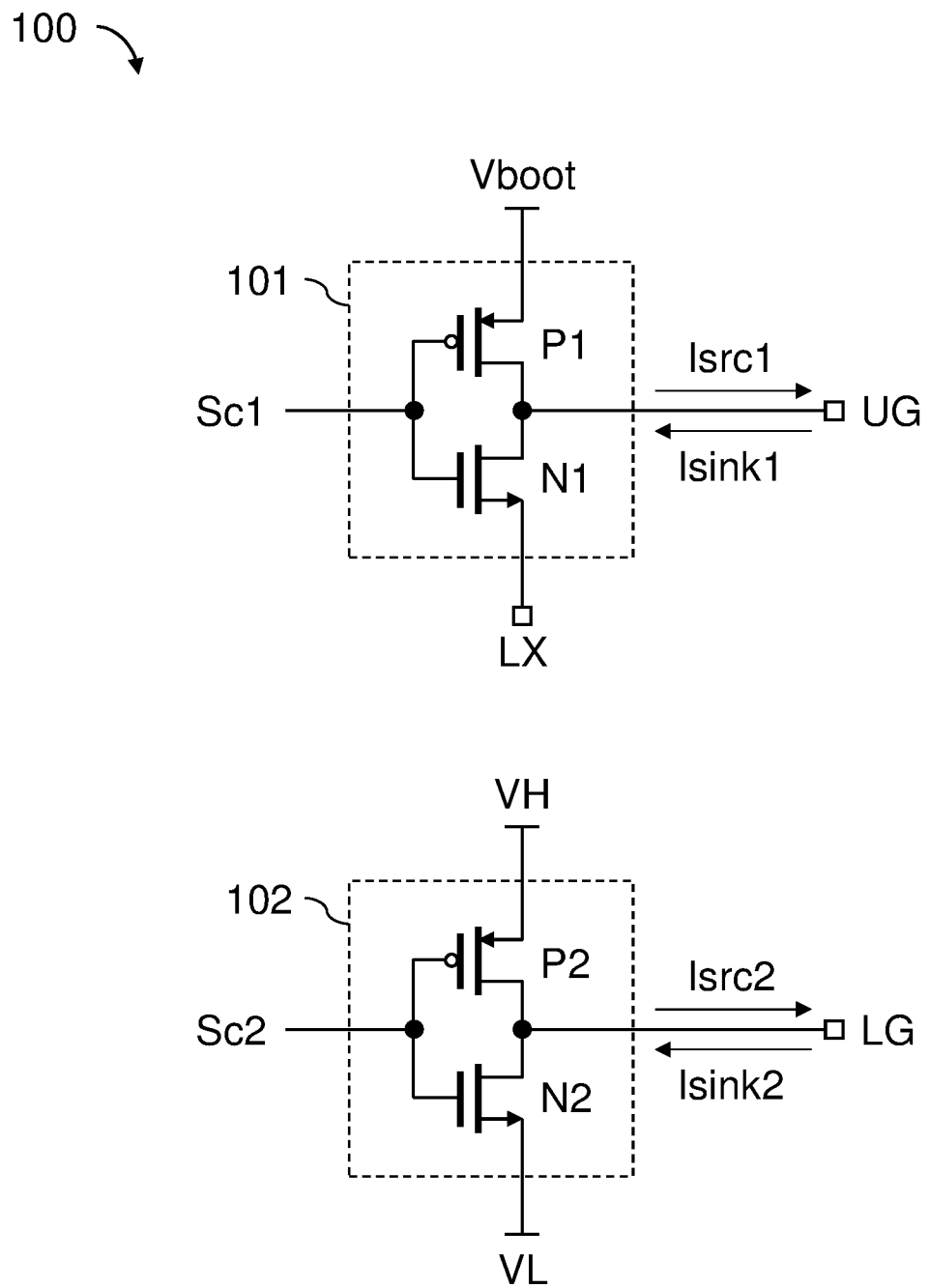
FIG. 2 is a schematic circuit diagram of a switch selection circuit according to an embodiment of the present invention.

Please refer to FIG. 2, which is a schematic circuit diagram of a switch selection circuit 100 according to an embodiment of the present invention, wherein the switch selection circuit 100 includes a high-side switch selection circuit 101 and a low-side switch selection circuit 102. As shown in FIG. 2, in some embodiments, the high-side switch selection circuit 101 includes switches P1 and N1 coupled to the gate UG of the high-side switch QU, and the low-side switch selection circuit 102 includes switches P2 and N2 coupled to the gate LG of the low-side switch QL, wherein the switches P1 and P2 are, for example but not limited to, the P-type MOS devices shown in FIG. 2, and the switches N1 and N2 are, for example but not limited to, the N-type MOS devices shown in FIG. 2.

Please still refer to FIG. 2; the source of the switch P1 is coupled to the power supply voltage Vboot; the source of the switch N1 is coupled to the node LX of the half-bridge circuit 200; the source of the switch P2 is coupled to a high power voltage VH; and the source of the switch N2 is coupled to a low power voltage VL. The high power voltage VH is, for example but not limited to, equal to the internal voltage GVDD shown in FIG. 1, and the low power voltage VL is, for example but not limited to, equal to the ground potential GND shown in FIG. 1. In some embodiments, the high-side switch selection circuit 101 is configured to turn on or off the high-side switch QU according to a control signal Sc1, and generates the high-side source current Isrc1 to pull up or generates the high-side sink current Isink1 to pull down the gate-source voltage of the high-side switch QU, thereby turning on or off the high-side switch QU. In some embodiments, the low-side switch selection circuit 102 is configured to turn on or off the low-side switch QL according to a control signal Sc2, and generates the low-side source current Isrc2 to pull up or generates the low-side sink current Isink2 to pull down the gate-source voltage of the low-side switch QL, thereby turning on or off the low-side switch QL.

Please refer to FIG. 1 again; in some embodiments, the half-bridge driver 10 further includes a level shifter circuit 120 configured to shift (raise) a level of the control signal Sc to generate the control signal Sc1, which is then inputted to the high-side switch selection circuit 101 to drive the high-side switch QU. In some embodiments, the half-bridge driver 10 further includes an inverter INV for inverting the control signal Sc to generate a control signal Sc2, which is inputted the low-side switch selection circuit 102 to drive the low-side switch QL. The structure and function of the inverter INV are well known to those with ordinary knowledge in the technical field to which the present invention pertains, and thus are not be explained in detail herein.

Figure 3:
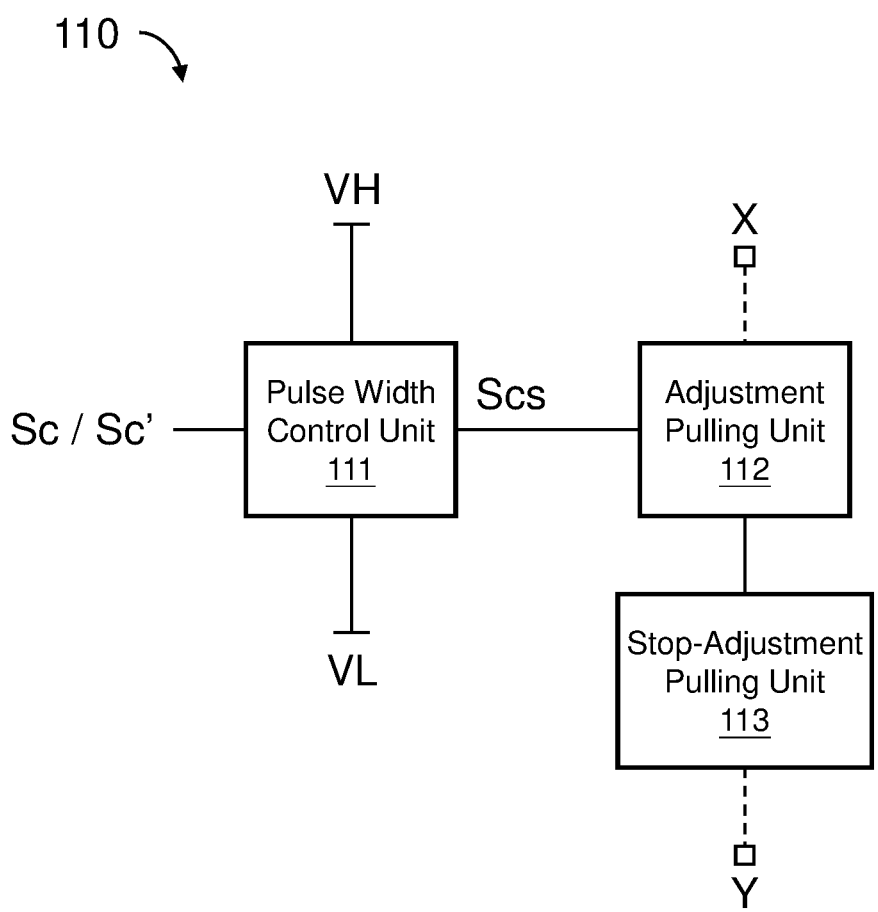
FIG. 3 is a modular block diagram of a slew rate adjustment circuit according to an embodiment of the present invention.

Please refer to FIG. 3. FIG. 3 is a modular block diagram of the slew rate adjustment circuit 110 according to an embodiment of the present invention. As shown in FIG. 3, in some embodiments, the slew rate adjustment circuit 110 includes a pulse width control unit 111, an adjustment pulling unit 112, and a stop-adjustment pulling unit 113. The high power voltage VH and the low power voltage VL supply power to the pulse width control unit 111; the adjustment pulling unit 112 is coupled to the pulse width control unit 111 and a node X; and the stop-adjustment pulling unit 113 is coupled to the adjustment pulling unit 112 and a node Y. The powers, voltages, and pin positions corresponding to the node X and the node Y will be described later. Referring to FIG. 1 and FIG. 3, in some embodiments, the voltage difference between the high power voltage VH and the low power voltage VL is less than the voltage difference between the power supply voltage Vboot and a ground potential GND. In some embodiments, the voltage difference between the high power voltage VH and the low power voltage VL is not greater than 5 volts, and the power supply voltage Vboot is not less than 20 volts, wherein the low power voltage VL is, for example, 0 volts, and the ground potential GND is, for example, 0 volts.

Figure 4A:
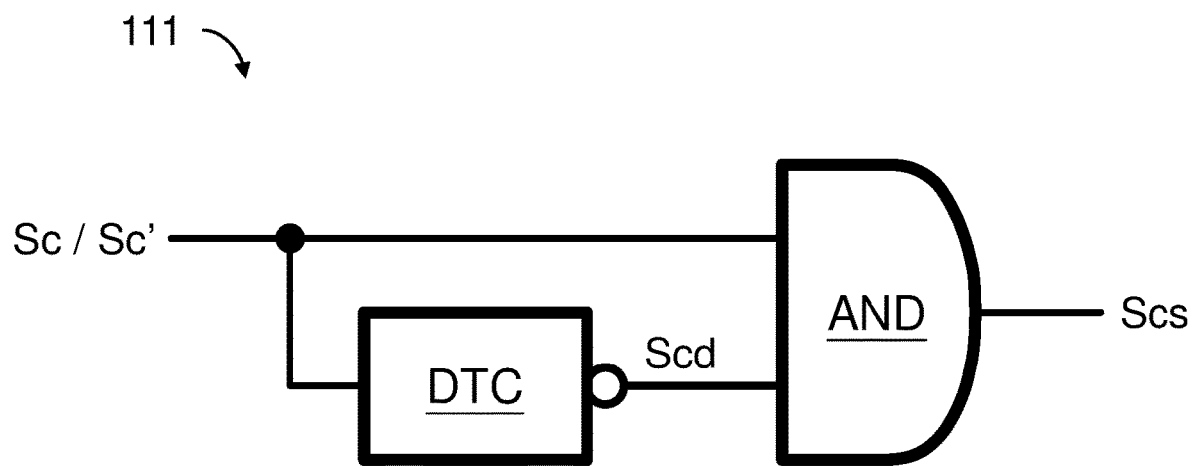
FIG. 4A is a schematic circuit diagram of a pulse width control unit according to an embodiment of the present invention.
Figure 4B:
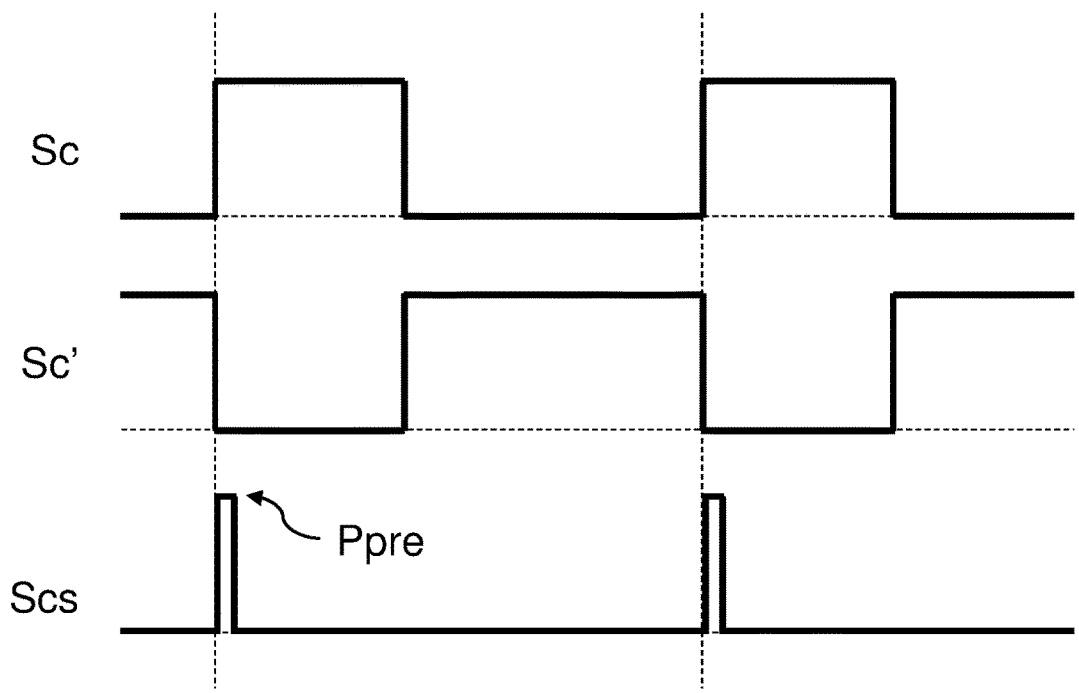
FIG. 4B is a waveform schematic diagram of a pulse width control unit according to an embodiment of the present invention.

In some embodiments, the pulse width control unit 111 is configured to generate an adjustment pulling control signal Scs with a preset pulse Ppre according to the control signal Sc or the control signal Sc', wherein the control signal Sc' is an inverted signal of the control signal Sc. Please refer to FIG. 4A and FIG. 4B together, wherein FIG. 4A is a schematic circuit diagram of the pulse width control unit 111 according to an embodiment of the present invention, and FIG. 4B is a waveform diagram depicting the operation of the pulse width control unit 111 according to an embodiment of the present invention. As shown in FIG. 4A and FIG. 4B, in some embodiments, the pulse width control unit 111 includes a delay time circuit DTC and an AND gate AND, wherein the structures and functions of the delay time circuit DTC and the AND gate AND are well known to those with ordinary knowledge in the technical field to which the present invention pertains, so they are not explained in detail herein. In some embodiments, the delay time circuit DTC is configured to delay the control signal Sc or the control signal Sc' for a delay period and inverting the phase of the control signal Sc or the control signal Sc' to generate a control signal Scd, and the AND gate AND is configured to perform a logical operation on the control signal Sc or the control signal Sc' and the delayed control signal Scd to generate the adjustment pulling control signal Scs with the preset pulse Ppre, wherein the pulse width of the preset pulse Ppre is related to the aforementioned delay period, which can be adjusted according to different requirements.

Figure 5A:
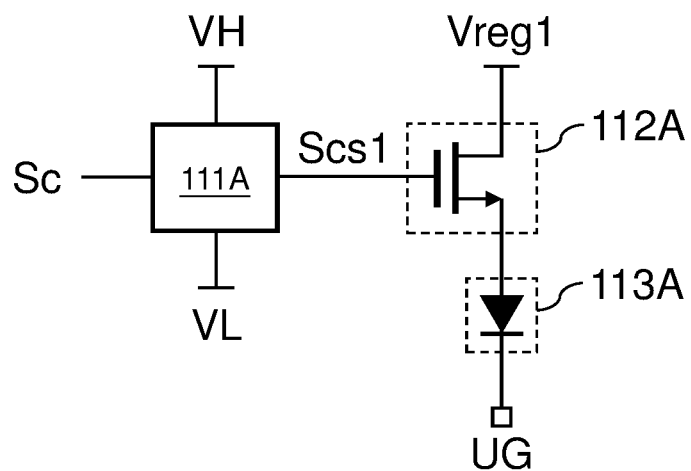
FIG. 5A is a schematic circuit diagram of a slew rate adjustment circuit according to an embodiment of the present invention.
Figure 5B:
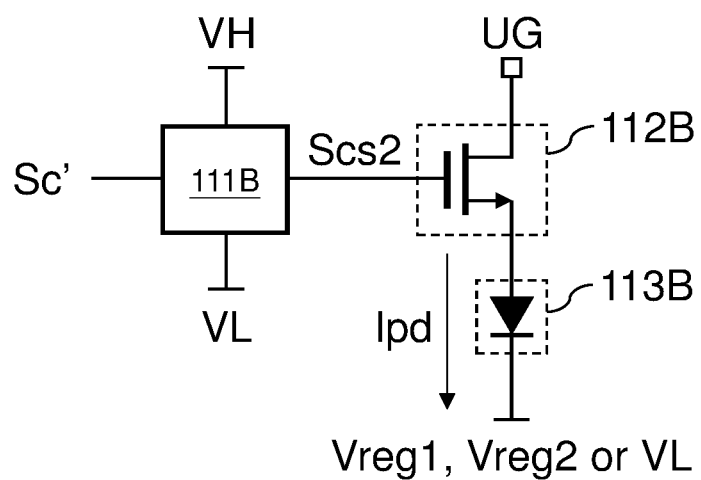
FIG. 5B is a schematic circuit diagram of a slew rate adjustment circuit according to an embodiment of the present invention.
Figure 5C:
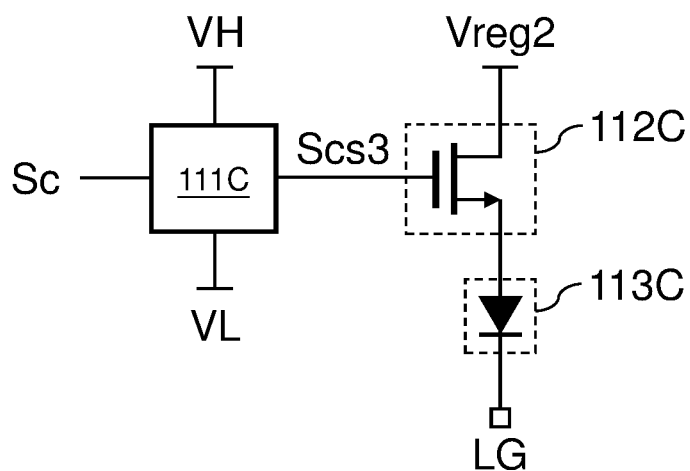
FIG. 5C is a schematic circuit diagram of a slew rate adjustment circuit according to an embodiment of the present invention.
Figure 5D:
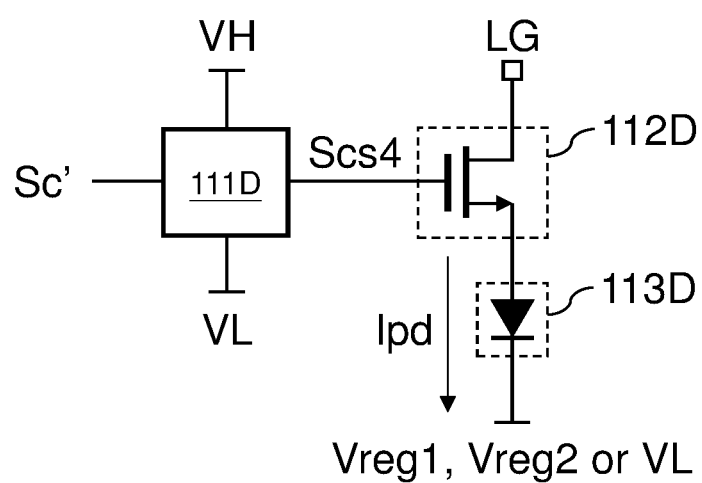
FIG. 5D is a schematic circuit diagram of a slew rate adjustment circuit according to an embodiment of the present invention.

In some embodiments, the slew rate adjustment circuit 110 includes a high-side adjustment pull-up slew rate adjustment circuit 110A, a high-side adjustment pull-down slew rate adjustment circuit 110B, a low-side adjustment pull-up slew rate adjustment circuit 110C, and/or a low-side adjustment pull-down slew rate adjustment circuit 110D. Taking FIG. 1 as an example, in this embodiment, the slew rate adjustment circuit 110 shown in FIG. 1 includes at least one of the aforementioned four types of slew rate adjustment circuits. Please refer to FIGS. 5A to 5D. FIGS. 5A to 5D are schematic circuit diagrams of the slew rate adjustment circuit 110 according to some embodiments of the present invention, wherein FIG. 5A shows the high-side adjustment pull-up slew rate adjustment circuit 110A; FIG. 5B shows the high-side adjustment pull-down slew rate adjustment circuit 110B; FIG. 5C shows the low-side adjustment pull-up slew rate adjustment circuit 110C; and FIG. 5D shows the low-side adjustment pull-down slew rate adjustment circuit 110D. The structures and functions of the high-side adjustment pull-up slew rate adjustment circuit 110A, the high-side adjustment pull-down slew rate adjustment circuit 110B, the low-side adjustment pull-up slew rate adjustment circuit 110C, and the low-side adjustment pull-down slew rate adjustment circuit 110D will be explained in detail below.

As shown in FIG. 5A, in some embodiments, the high-side adjustment pull-up slew rate adjustment circuit 110A includes a pulse width control unit 111A, an adjustment pulling unit 112A, and a stop-adjustment pulling unit 113A, wherein the adjustment pulling unit 112A is coupled to a regulating voltage Vreg1 (corresponding to the node X in FIG. 3), and the stop-adjustment pulling unit 113A is coupled to the gate UG (corresponding to the node Y in FIG. 3) of the high-side switch QU. In some embodiments, the adjustment pulling unit 112A is configured to adjust (to pull up) the gate-source voltage of the high-side switch QU according to the adjustment pulling control signal Scs1 (corresponding to the adjustment pulling control signal Scs in FIG. 3) generated by the pulse width control unit 111A, so as to adjust a high-side adjustment pull-up slew rate of the gate-source voltage of the high-side switch QU, thereby adjusting the slew rate of the output voltage Vout. In some embodiments, the stop-adjustment pulling unit 113A is configured to stop the adjustment of pulling up the gate-source voltage of the high-side switch QU according to a preset threshold. In the present embodiment, only the stop-adjustment pulling unit 113A coupled to the gate of the high-side switch QU is required to withstand high voltage, while the other circuits such as the pulse width control unit 111A and the adjustment pulling unit 112A all operate in the low voltage range. Therefore, in the high-side adjustment pull-up slew rate adjustment circuit 110A, except for the stop-adjustment pulling unit 113A, other devices can be low-voltage devices.

As shown in FIG. 5B, in some embodiments, the high-side adjustment pull-down slew rate adjustment circuit 110B includes a pulse width control unit 111B, an adjustment pulling unit 112B, and a stop-adjustment pulling unit 113B, wherein the adjustment pulling unit 112B is coupled to the gate UG (corresponding to the node X in FIG. 3) of the high-side switch QU, and the stop-adjustment pulling unit 113B is coupled to the regulating voltage Vreg1 or Vreg2 or the low power voltage VL (corresponding to the node Y in FIG. 3). In some embodiments, the adjustment pulling unit 112B is configured to adjust (to pull down) the gate-source voltage of the high-side switch QU according to the adjustment pulling control signal Scs2 (corresponding to the adjustment pulling control signal Scs in FIG. 3) generated by the pulse width control unit 111B, so as to adjust a high-side adjustment pull-down slew rate of the gate-source voltage of the high-side switch QU, thereby adjusting the slew rate of the output voltage Vout. In some embodiments, the stop-adjustment pulling unit 113B is configured to stop the adjustment of pulling down the gate-source voltage of the high-side switch QU according to the preset threshold. In some embodiments, the regulating voltage Vreg1 is, for example, 3.3 volts, and the regulating voltage Vreg2 is, for example, 1.8 volts. In the present embodiment, only the adjustment pulling unit 112B coupled to the gate of the high-side switch QU is required to withstand high voltage, while the other circuits such as the pulse width control unit 111B and the stop-adjustment pulling unit 113B operate in the low voltage range. Therefore, in the high-side adjustment pull-up slew rate adjustment circuit 110B, except for the adjustment pulling unit 112B, other devices can be low-voltage devices. Note that, the high power voltage VH (for example but not limited to 5V) is not less than the regulating voltage Vreg1 (for example but not limited to 3.3V); the regulating voltage Vreg1 is not less than the regulating voltage Vreg2 (for example but not limited to 1.8V); and the regulating voltage Vreg2 is not less than the low power voltage VL (for example but not limited to 0V).

As shown in FIG. 5C, in some embodiments, the low-side adjustment pull-up slew rate adjustment circuit 110C includes a pulse width control unit 111C, an adjustment pulling unit 112C, and a stop-adjustment pulling unit 113C, wherein the adjustment pulling unit 112C is coupled to the regulating voltage Vreg2 (corresponding to the node X in FIG. 3), and the stop-adjustment pulling unit 113C is coupled to the gate LG (corresponding to the node Y in FIG. 3) of the low-side switch QL. In some embodiments, the adjustment pulling unit 112C is configured to adjust (to pull up) the gate-source voltage of the low-side switch QL according to the adjustment pulling control signal Scs3 (corresponding to the adjustment pulling control signal Scs in FIG. 3) generated by the pulse width control unit 111C, so as to adjust a low-side adjustment pull-up slew rate of the gate-source voltage of the low-side switch QL, thereby adjusting the slew rate of the output voltage Vout. In some embodiments, the stop-adjustment pulling unit 113C is configured to stop the adjustment of pulling up the gate-source voltage of the low-side switch QL according to a preset threshold.

As shown in FIG. 5D, in some embodiments, the low-side adjustment pull-down slew rate adjustment circuit 110D includes a pulse width control unit 111D, an adjustment pulling unit 112D, and a stop-adjustment pulling unit 113D, wherein the adjustment pulling unit 112D is coupled to the gate LG (corresponding to the node X in FIG. 3) of the low-side switch QL, and the stop-adjustment pulling unit 113D is coupled to the regulating voltages Vreg1, Vreg2 or the low power voltage VL (corresponding to the node Y in FIG. 3). In some embodiments, the adjustment pulling unit 112D is configured to adjust (to pull down) the gate-source voltage of the low-side switch QL according to the adjustment pulling control signal Scs4 (corresponding to the adjustment pulling control signal Scs in FIG. 3) generated by the pulse width control unit 111D, so as to adjust a low-side adjustment pull-down slew rate of the gate-source voltage of the low-side switch QL, thereby adjusting the slew rate of the output voltage Vout. In some embodiments, the stop-adjustment pulling unit 113D is configured to stop the adjustment of pull down the gate-source voltage of the low-side switch QL according to the preset threshold.

Please refer to FIG. 5B and FIG. 5D again, in some embodiments, when the high-side adjustment pull-down slew rate adjustment circuit 110B and/or the low-side adjustment pull-down slew rate adjustment circuit 110D adjusts the gate-source voltage of the high-side switch QU and/or the low-side switch QL, an adjustment pull-down current Ipd is generated, which flows through the corresponding stop-adjustment pulling unit 113B or 113D, and flows to the regulating power (for example, the regulating voltage Vreg1 or the regulating voltage Vreg2), so that the electric energy of the adjustment pull-down current Ipd can be reused.

Figure 6A:
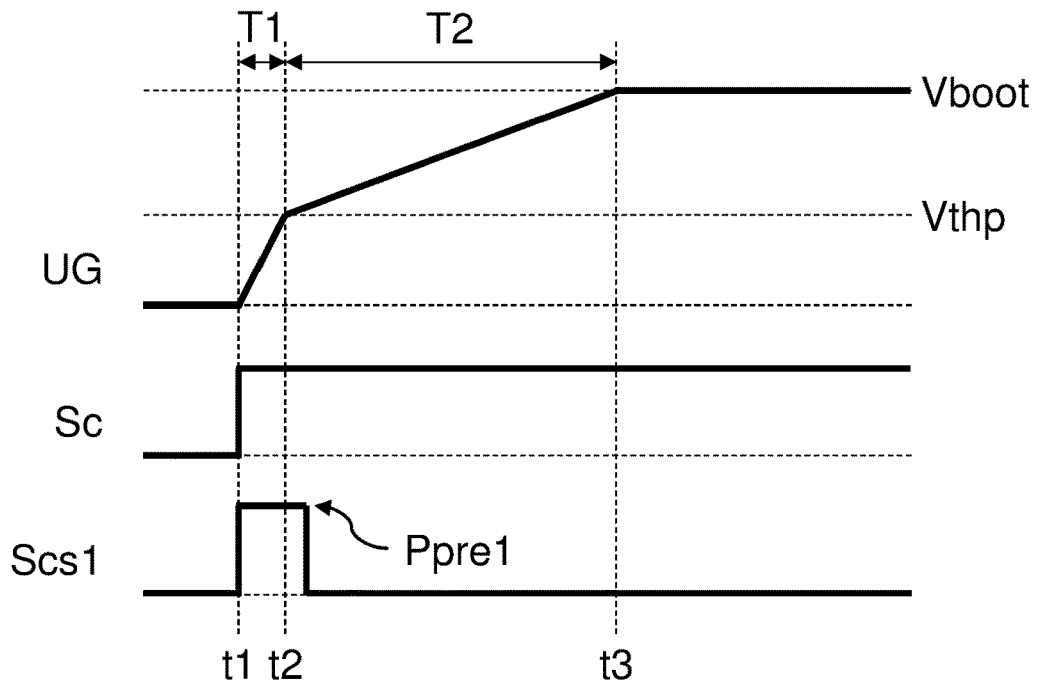
FIG. 6A is a waveform diagram depicting the operation of a slew rate adjustment circuit according to an embodiment of the present invention.
Figure 6B:
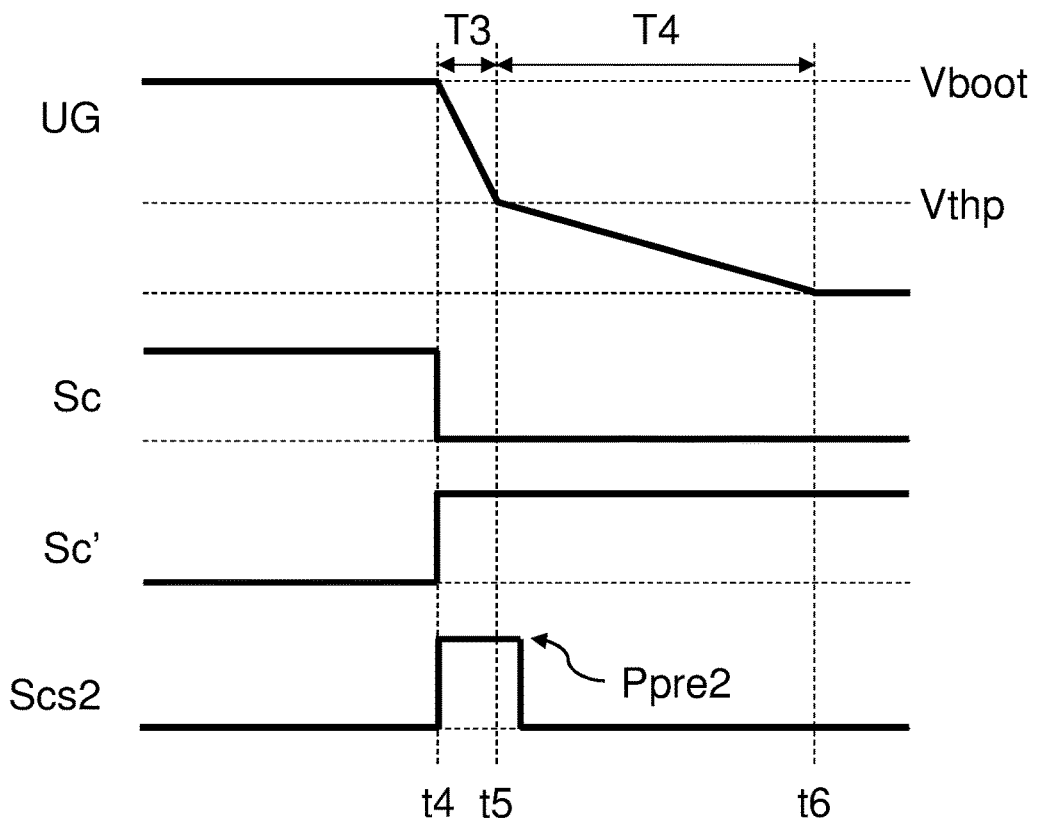
FIG. 6B is a waveform diagram depicting the operation of a slew rate adjustment circuit according to an embodiment of the present invention.

Please refer to FIG. 6A and FIG. 6B. FIG. 6A and FIG. 6B are zoom-in waveform diagrams depicting the operation of the slew rate adjustment circuit 110 in some embodiments of the present invention, wherein FIG. 6A shows a waveform diagram of the high-side adjustment pull-up slew rate adjustment circuit 110A when pulling up the gate-source voltage of the high-side switch QU of the FIG. 5A, and FIG. 6B shows a waveform diagram of the high-side adjustment pull-down slew rate adjustment circuit 110B when pulling down the gate-source voltage of the high-side switch QU of the FIG. 5B. How the half-bridge driver 10 drives the half-bridge circuit 200 will be described below with reference to FIG. 6A and FIG. 6B.

As shown in FIG. 6A, in the present embodiment, at time point t1, the pulse width control unit 111A generates an adjustment pulling control signal Scs1 with a preset pulse Ppre1 according to the control signal Sc. Subsequently, the adjustment pulling unit 112A pulls up the gate-source voltage (indicated by UG) of the high-side switch QU for an adjustment period (corresponding to the period T1) according to the adjustment pulling control signal Scs1. At time point t2, since the gate-source voltage UG of the high-side switch QU is pulled up to the preset threshold Vthp, the stop-adjustment pulling unit 113A stops the adjustment of pulling up the gate-source voltage of the high-side switch QU. Finally, during the period T2, the switch P1 of the high-side switch selection circuit 101 pulls up the gate-source voltage of the high-side switch QU until the gate-source voltage of the high-side switch QU reaches a certain value (which is able to turn on the high-side switch QU), and at the time point t3, the gate-source voltage of the high-side switch QU is stopped to be pulled up. In some embodiments, the adjustment period (period T1) is related to the pulse width of the preset pulse Ppre1, the preset threshold Vthp, the level of the adjustment pulling control signal Scs1, and/or the regulating voltage Vreg1.

Please also refer to FIG. 5A, in one embodiment, the adjustment pulling unit 112A is for example but not limited to the N-type MOS device shown in FIG. 5A, and the stop-adjustment pulling unit 113A is for example but not limited to the diode shown in FIG. 5A. When the control signal Sc generates a preset pulse Ppre1 and the adjustment pulling control signal Scs1 changes from low level to high level, the adjustment pulling unit 112A is turned on, so as to generate an adjustment pull up current flowing through the pulling unit 112A and the stop-adjustment pulling unit 113A, which is added with the high-side source current Isrc1 to increase the current charging the gate-source capacitor of the high-side switch QU, so as to speed up pulling up the gate-source voltage of the high-side switch QU. Such speed up operation in pulling up of the gate-source voltage of the high-side switch continues until the gate-source voltage of the high-side switch QU reaches the preset threshold Vthp (time point t2), at which time point the difference of the regulating voltage Vreg1 minus the preset threshold Vthp is not less than the forward conduction voltage of the diode of the stop-adjustment pulling unit 113A, so the diode is not conducted, and the adjustment pull up current is zero, thus stopping the operation to speed up pulling up the gate-source voltage of the high-side switch QU. In the present embodiment, the adjustment period (corresponding to the period T1) is determined by the forward conduction voltage of the diode (corresponding to the preset threshold Vthp) and the regulating voltage Vreg1. In another embodiment, the adjustment period can also be determined by the level of the adjustment pulling control signal Scs1 and/or the regulating voltage Vreg1. The embodiments of FIGS. 5B, 5C, and 5D can operate similarly by the same operation mechanism of FIG. 5A, so the operations of these embodiments are not redundantly explained here.

As shown in FIG. 6B, in the present embodiment, at time point t4, the pulse width control unit 111B generates an adjustment pulling control signal Scs2 with a preset pulse Ppre2 according to the control signal Sc'. Subsequently, the adjustment pulling unit 112B pulls down the gate-source voltage of the high-side switch QU for an adjustment period (corresponding to the period T3) according to the adjustment pulling control signal Scs2. At time point t5, since the gate-source voltage of the high-side switch QU is pulled down to the preset threshold Vthp, the stop-adjustment pulling unit 113B stops the operation of pulling down the gate-source voltage of the high-side switch QU. Finally, in the period T4, the switch N1 of the high-side switch selection circuit 101 pulls down the gate-source voltage of the high-side switch QU until the gate-source voltage of the high-side switch QU reaches the level of the output voltage Vout (for example, 0 volt) and stops at time point t6 (the high-side switch QU is turned off). In some embodiments, the adjustment period (period T3) is related to the pulse width of the preset pulse Ppre2, the preset threshold Vthp, the level of the adjustment pulling control signal Scs2, the regulating voltages Vreg1, Vreg2, and/or the low power voltage VL.

In some embodiments, the adjustment pulling units 112A, 112B, 112C, and 112D include at least one MOS device, and the adjustment period is related to the number of MOS devices coupled in parallel. In some embodiments, the MOS device(s) of the adjustment pulling unit 112B of the high-side adjustment pull-down slew rate adjustment circuit 110B has a withstand voltage (i.e., is capable of withstanding a voltage) greater than the voltage difference between the input voltage Vin and the ground potential GND.

In some embodiments, the stop-adjustment pulling units 113A, 113B, 113C, 113D include at least one diode device, and the aforementioned preset threshold Vthp is related to the number of diode devices coupled in series, wherein as the number of diode devices increases, the preset threshold Vthp becomes larger. In some embodiments, the diode device(s) of the stop-adjustment pulling unit 113A of the high-side adjustment pull-up slew rate adjustment circuit 110A has a withstand voltage (i.e., is capable of withstanding a voltage) greater than the voltage difference between the input voltage Vin and the ground potential GND. In some embodiments, the stop-adjustment pulling units 113A, 113B, 113C, and 113D are unidirectional conduction devices capable of preventing a reverse current flow.

Figure 7A:
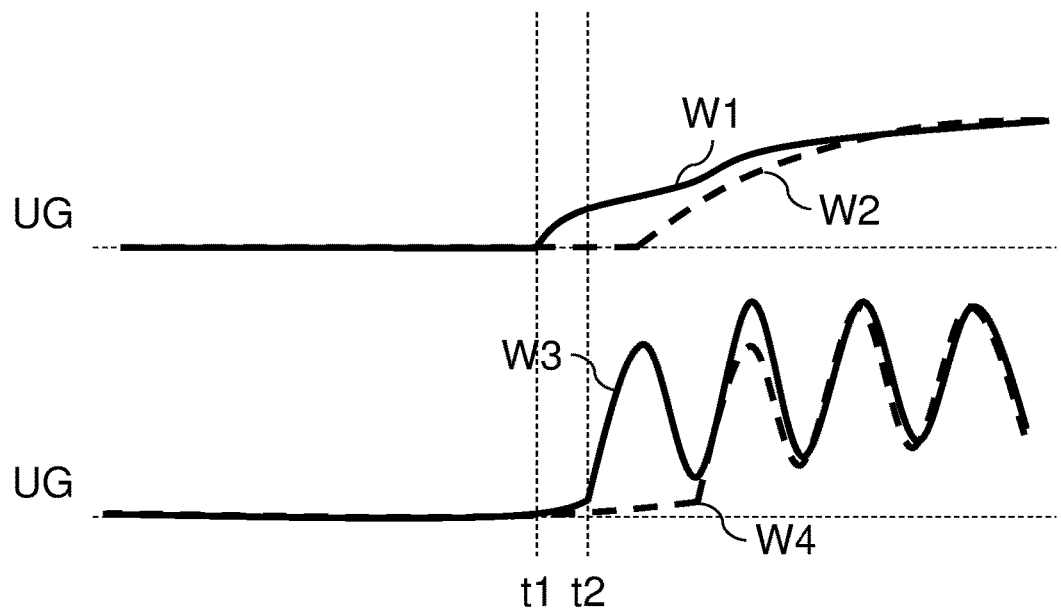
FIG. 7A shows the waveforms at a gate of a high-side switch according to an embodiment of the present invention versus conventional art.

Please refer to FIG. 7A, FIG. 7A shows waveforms of the voltage at the gate UG of the high-side switch QU according to an embodiment of the present invention versus conventional art. In the figure, the waveform W1 is the behavior of the half-bridge driver 10 of the present invention wherein the parasitic inductance is ignored; the waveform W2 is the behavior of a conventional art which does not use the half-bridge driver 10 of the present invention wherein the parasitic inductance is ignored; the waveform W3 is the behavior of the half-bridge driver 10 of the present invention wherein the parasitic inductance is taken into consideration (wherein the parasitic inductance is generated, for example, by wire bonding during IC packaging); and the waveform W4 is the behavior of a conventional art which does not use the half-bridge driver 10 of the present invention wherein the parasitic inductance is taken into consideration. As shown in FIG. 7A, in the present embodiment, since the half-bridge driver 10 of the present invention adjusts to pull up the voltage of the gate UG of the high-side switch QU (i.e., pulling up the gate-source voltage of the high-side switch QU), the waveform W1 starts rises at time point t1 compared with the waveform W2. Similarly, the waveform W3 starts to pull up at the time point t2, which is earlier as compared with the waveform W4. Therefore, the switching speed of the high-side switch QU is increased according to the present invention.

Figure 7B:
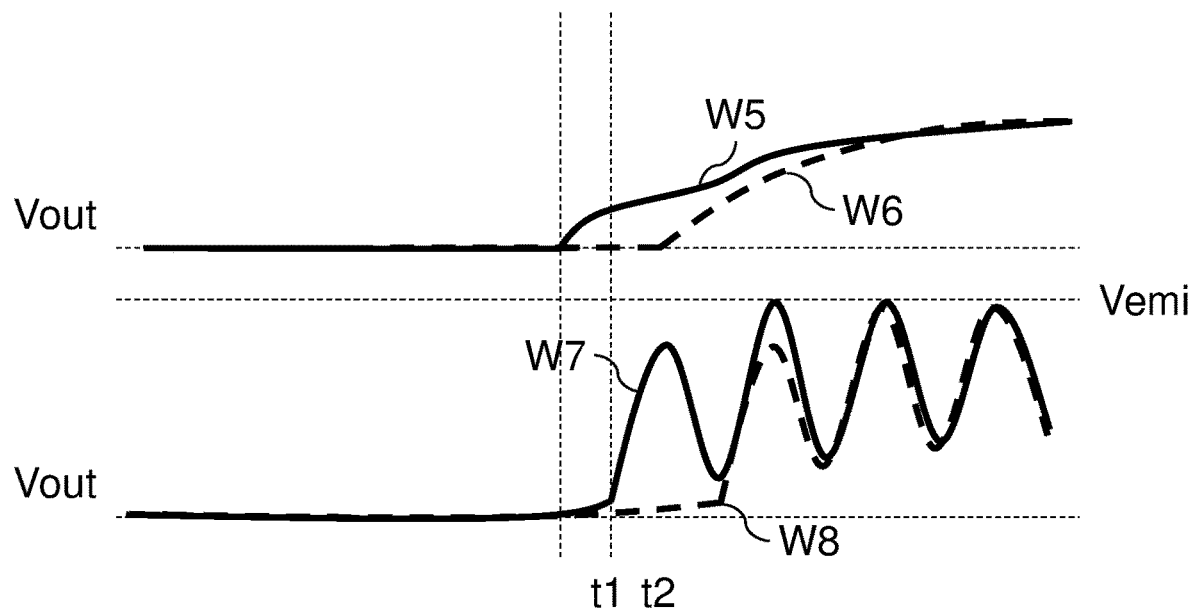
FIG. 7B shows the waveforms of an output voltage of a half-bridge circuit according to an embodiment of the present invention versus conventional art.

Please further refer to FIG. 7B. FIG. 7B shows waveforms of the output voltage Vout of the half-bridge circuit 200 according to an embodiment of the present invention versus conventional art. In the figure, the waveform W5 is the behavior of the half-bridge driver 10 of the present invention wherein the parasitic inductance is ignored; the waveform W6 is the behavior of a conventional art which does not use the half-bridge driver 10 of the present invention wherein the parasitic inductance is ignored; the waveform W7 is the behavior of the half-bridge driver 10 of the present invention wherein the parasitic inductance is taken into consideration; and waveform W8 is the behavior of a conventional art which does not use the half-bridge driver 10 of the present invention wherein the parasitic inductance is taken into consideration. As shown in FIG. 7B, in the present embodiment, since the half-bridge driver 10 of the present invention adjusts to pull up the voltage of the gate UG of the high-side switch QU (as shown in FIG. TA), the slew rate of the output voltage Vout can be adjusted (as shown by waveform W5 and waveform W7). In addition, according to the present invention, the adjustment of pulling up the voltage of the gate UG of the high-side switch QU can be terminated in a timely manner, and the mechanism of the stop-adjustment pulling unit 113 ensures that the level of the output voltage Vout does not exceed a certain value (for example, an electromagnetic interference threshold Vemi which triggers the electromagnetic interference), thereby alleviating the electromagnetic interference issue.

To sum up, the half-bridge driver 10 of the present invention can adjust the slew rate of the output voltage Vout by pulling up and/or pulling down the gate-source voltage of the high-side switch QU and/or the low-side switch QL, which has an effect of solving the electromagnetic interference problem, and further, the half-bridge driver 10 of the present invention can reduce the on-time or off-time of the high-side switch QU or the low-side switch QL in the half-bridge circuit 200, which can improve the efficiency of converting the input signal Vin into the output signal Vout.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A half-bridge driver for driving a half-bridge circuit, wherein the half-bridge circuit comprises a high-side switch and a low-side switch connected in series with each other, and the half-bridge driver comprises:
    a switch selection circuit, configured to turn on or off the high-side switch or the low-side switch according to a control signal, and to generate a source current or a sink current to correspondingly pull up or pull down a gate-source voltage of the high-side switch or the low-side switch, so as to turn on or turn off the high-side switch or the low-side switch, to thereby convert an input voltage into an output voltage; and
    at least one slew rate adjustment circuit, coupled to the half-bridge circuit, wherein the slew rate adjustment circuit comprises:
        a pulse width control unit, configured to generate an adjustment pulling control signal with a preset pulse according to the control signal;
        an adjustment pulling unit, configured to pull up or pull down the gate-source voltage of the high-side switch or the low-side switch according to the adjustment pulling control signal, so as to adjust a slew rate of the output voltage; and
        a stop-adjustment pulling unit, coupled to the adjustment pulling unit, configured to stop pulling up or pulling down the gate-source voltage of the high-side switch or the low-side switch according to a preset threshold;
    wherein a voltage difference between a high power voltage and a low power voltage of the slew rate adjustment circuit is less than a voltage difference between a power supply voltage and a ground potential;
    wherein the power supply voltage is higher than the input voltage and the output voltage;
    wherein the adjustment pulling unit pulls up or pulls down the gate-source voltage of the high-side switch or the low-side switch for an adjustment period, and the adjustment period is related to at least one of a pulse width of the preset pulse, the preset threshold, and a level of the adjustment pulling control signal.

2. The half-bridge driver of claim 1, wherein the at least one slew rate adjustment circuit comprises at least one of a high-side adjustment pull-up slew rate adjustment circuit, a high-side adjustment pull-down slew rate adjustment circuit, a low-side adjustment pull-up slew rate adjustment circuit, and a low-side adjustment pull-down slew rate adjustment circuit.

3. The half-bridge driver of claim 1, wherein the adjustment pulling unit comprises at least one MOS device, and the adjustment period is related to a number of the at least one MOS device coupled in parallel.

4. The half-bridge driver of claim 1, wherein the stop-adjustment pulling unit comprises at least one diode device, and the preset threshold is related to a number of the at least one diode device coupled in series.

5. The half-bridge driver of claim 1, wherein the slew rate adjustment circuit comprises at least one of the high-side adjustment pull-down slew rate adjustment circuit and the low-side adjustment pull-down slew rate adjustment circuit, and during the adjustment period, at least one of the high-side adjustment pull-down slew rate adjustment circuit and the low-side adjustment pull-down slew rate adjustment circuit correspondingly pulls down the gate-source voltage of the high-side switch or the low-side switch to generate an adjustment pull-down current, which flows through the corresponding stop-adjustment pulling unit to a regulating power, so that the electric energy of the adjustment pull-down current is reusable.

6. The half-bridge driver of claim 1, wherein the stop-adjustment pulling unit is a unidirectional conduction device for preventing a reverse current flow.

7. The half-bridge driver of claim 1, wherein the switch selection circuit comprises:
    a high-side switch selection circuit, configured to turn on or off the high-side switch according to the control signal, and to generate a high-side source current or a high-side sink current to correspondingly pull up or pull down the gate-source voltage of the high-side switch, thereby turning on or off the high-side switch; and
    a low-side switch selection circuit, configured to turn on or turn off the low-side switch according to the control signal, and to generate a low-side source current or a low-side sink current to correspondingly pull up or pull down the gate-source voltage of the low-side switch, thereby turning on or off the low-side switch;
    wherein the source current comprises the high-side source current or the low-side source current; and
    wherein the sink current comprises the high-side sink current or the low-side sink current.

8. The half-bridge driver of claim 7, further comprising a level shifter circuit configured to shift the level of the control signal to generate a level-shifted control signal and input the level-shifted control signal to the high-side switch selection circuit.

9. The half-bridge driver of claim 3, wherein the at least one MOS device of the adjustment pulling unit of the high-side adjustment pull-down slew rate adjustment circuit has a withstand voltage greater than a voltage difference between the input voltage and the ground potential.

10. The half-bridge driver of claim 4, wherein the at least one diode device of the stop-adjustment pulling unit of the high-side adjustment pull-up slew rate adjustment circuit has a withstand voltage greater than a voltage difference between the input voltage and the ground potential.

11. The half-bridge driver of claim 1, wherein a voltage difference between the high power voltage and the low power voltage is not greater than 5 volts, and the supply voltage is not less than 20 volts.

12. A half-bridge driving method for driving a half-bridge circuit, wherein the half-bridge circuit comprises a high-side switch and a low-side switch connected in series with each other, and the half-bridge driving method comprises:
    determining to turn on or turn off the high-side switch or the low-side switch according to a control signal, and generating a source current or a sink current to correspondingly pull up or pull down the gate-source voltage of the high-side switch or the low-side switch, thereby turning on or off the high-side switch or the low-side switch, so as to convert an input voltage into an output voltage; and a slew rate adjustment step, comprising:
- generating an adjustment pulling control signal with a preset pulse according to the control signal;
- pulling up or pulling down the gate-source voltage of the high-side switch or the low-side switch according to the adjustment pulling control signal, so as to adjust a slew rate of the output voltage; and
- stopping pulling up or pulling down the gate-source voltage of the high-side switch or the low-side switch according to a preset threshold;

wherein the slew rate adjustment step is executed between a high power voltage and a low power voltage, and a voltage difference between the high power voltage and the low power voltage is less than a voltage difference between a power supply voltage and a ground potential;

wherein the power supply voltage is greater than the input voltage and the output voltage;

wherein the step of pulling up or pulling down the gate-source voltage of the high-side switch the low-side switch according to the adjustment pulling control signal is executed for an adjustment period, and the adjustment period is related to at least one of a pulse width of the preset pulse, the preset threshold, and a level of the adjustment pulling control signal.

13. The half-bridge driving method of claim 12, wherein the slew rate adjustment step is configured to adjust at least one of a high-side adjustment pull-up slew rate, a high-side adjustment pull-down slew rate, a low-side adjustment pull-up slew rate, and a low-side adjustment pull-down slew rate.

14. The half-bridge driving method of claim 12, wherein in the step of pulling up or pulling down the gate-source voltage of the high-side switch or the low-side switch according to the adjustment pulling control signal, one MOS device is turned on or plural MOS devices coupled in parallel are turned on for the adjustment period to pull up or pull down gate-source voltage of the high-side switch or the low-side switch, and the adjustment period is further related to a number of the one or plural MOS devices.

15. The half-bridge driving method of claim 12, wherein in the step of stopping pulling up or pulling down the gate-source voltage of the high-side switch or the low-side switch according to the preset threshold, one diode device or plural diode devices coupled in series decide to stop pulling up or pulling down the gate-source voltage of the high-side switch or the low-side switch, and the preset threshold is related to a number of the one or plural diode devices.

16. The half-bridge driving method of claim 12, wherein the slew rate adjustment step is configured to adjust at least one of the high-side adjustment pull-down slew rate and the low-side adjustment pull-down slew rate, and during the adjustment period, the slew rate adjustment step generates an adjustment pull-down current which flows to a regulating power, so that the electric energy of the adjustment pull-down current is reusable.

17. The half-bridge driving method of claim 12, wherein the step of stopping pulling up or pulling down the gate-source voltage of the high-side switch or the low-side switch is executed by employing a unidirectional conduction device for preventing a reverse current flow.

18. The half-bridge driving method of claim 14, wherein in the step of pulling down the gate-source voltage of the high-side switch, the one or plural MOS devices have a withstand voltage greater than a voltage difference between the input voltage and the ground potential.

19. The half-bridge driving method of claim 15, wherein in the step of pulling up the gate-source voltage of the high-side switch, the one or plural diode devices have a withstand voltage greater than a voltage difference between the input voltage and the ground potential.

20. The half-bridge driving method of claim 12, wherein a voltage difference between the high power voltage and the low power voltage is not greater than 5 volts, and the power supply voltage is not less than 20 volts.

* * * * *